(12) United States Patent
Uchida (10) Patent No.: US 7,072,535 B2
(45) Date of Patent: Jul. 4, 2006

(54) LAYERED BOARD, AND APPARATUS INCORPORATING SUCH LAYERED BOARD

(75) Inventor: Mamoru Uchida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 230 days.

(21) Appl. No.: 10/631,796

(22) Filed: Aug. 1, 2003

(65) Prior Publication Data

US 2004/0091719 A1    May 13, 2004

(30) Foreign Application Priority Data

Aug. 2, 2002    (JP)    ............................. 2002-225468

(51) Int. Cl.
    *G02B 6/12*    (2006.01)
(52) U.S. Cl. ........................................ 385/14; 385/131
(58) Field of Classification Search ........ 385/129–132, 385/14
    See application file for complete search history.

(56) References Cited

U.S. PATENT DOCUMENTS 5,835,646 A    11/1998    Yoshimura et al. ............ 385/14

6,324,328 B1 *    11/2001    Mehlhorn et al. ........... 385/131
6,330,377 B1    12/2001    Kosemura ..................... 385/14
6,539,157 B1 *    3/2003    Doi ............................. 385/129

FOREIGN PATENT DOCUMENTS

| EP | 1 219 994 A2 | 7/2002 |
| JP | 5-218384 | 8/1993 |
| JP | 2000-81524 | 3/2000 |
| JP | 2001-141949 | 5/2001 |
| JP | 2003-215372 | 7/2003 |

* cited by examiner

*Primary Examiner*—Akm Enayet Ullah
*Assistant Examiner*—Kevin S. Wood
(74) *Attorney, Agent, or Firm*—Fitzpatrick, Cella, Harper & Scinto (57) ABSTRACT

In a layered board, an insulating layer is interposed between a first layer capable of transmitting an electrical signal or an optical signal and a second layer capable of transmitting the electrical signal or the optical signal, interconnection of the signal between the first layer and the second layer is established through a signal connecting path penetrating the insulating layer, and the signal connecting path has both a function of transmitting the electrical signal and a function of transmitting the optical signal. An apparatus including the layered board may be constructed as a cellular phone.

1 Claim, 9 Drawing Sheets

LAYERED BOARD, AND APPARATUS INCORPORATING SUCH LAYERED BOARD

BACKGROUND OF THE INVENTION

1. Field of the Invention

The present invention relates to a layered board that is constructed by stacking a plurality of layers. The present invention particularly relates to a layered board applicable to equipment of LSIs (large scale integrations; generally, electronic devices), such as central processing units (CPUs) and memories, and an apparatus incorporating such a layered board.

2. Description of the Related Background Art

High-speed processing, small size, and light weight are all required in information communication terminals, such as cellular phones and personal digital assistants (PDAs). It can be, however, pointed out that adverse influences of wiring delays increase in electronic circuit boards as the processing rate goes up. The simplest method for solving such a disadvantage is to reduce the length of electric wires in chips or between chips to be as short as possible. This method can also achieve compact circuit boards.

Another problem, however, arises as the processing speed increases. This is the problem of electromagnetic interference (EMI) whose meaning is as follows. When electronic devices are disposed close to each other, the density of electrical wires increases even though the length of the wires decreases. As a result, when high-speed signals flow though signal wires arranged close to each other, electromagnetically-induced electromagnetic waves interfere with each other, and generate noises, thereby causing erroneous transmission of signals. Particularly, in mobile terminals, there occur more cases where the terminal is driven with larger current as its driving voltage decreases. Accordingly, the influence of the EMI is more serious.

As a method for preventing the EMI problem, there can be considered a method of enhancing electromagnetic compatibility (EMC) in each layer by layering ceramics boards, for example. This measure, however, has disadvantages in cost and yield. In addition, it cannot achieve an inherently EMI-free apparatus.

Further, when an electronic device is to be newly added on the basis of an existing wiring pattern, there is a fear that present circuits be adversely influenced by the added electronic device. In other words, it is sometimes desired to prevent adverse influences of the EMI caused by a specific device in the circuit.

From the above-discussed standpoint of view, there have been proposed methods of using optical wiring or interconnection which are inherently electromagnetic-induction-free, and can achieve EMI-free apparatuses.

U.S. Pat. No. 5,835,646 discloses the following active optical sheet, or active optical circuit board, for example. In this active optical circuit sheet, or active optical circuit board, an electro optical switch or optical modulator is driven with a voltage (SIGin) from an electronic device, the electrical signal (SIGin) is converted to an optical signal, transmitted and then converted to an electrical signal (SIGout) at an optical receiver element, and an electrical connection is formed between an optical wiring board and the electronic device for transmission of signals to another or the same electronic device, separating the electrical wiring at the electronic device end and the optical wiring at the optical wiring board end, or alternatively, SIGin and SIGout electrode pads are provided on the side of the optical wiring board on which the optical device is mounted or on the opposite side, for connection with the electronic device.

On the other hand, European Unexamined Patent Publication No. EP1219994A discloses a semiconductor device in which a plurality of electrical wiring layer and optical wiring layers are stacked, the electrical wiring layers is constructed based on a conventional scheme, and the optical wiring layer is constructed as a two-dimensional (sheet-shaped) optical waveguide layer.

Figure 8:
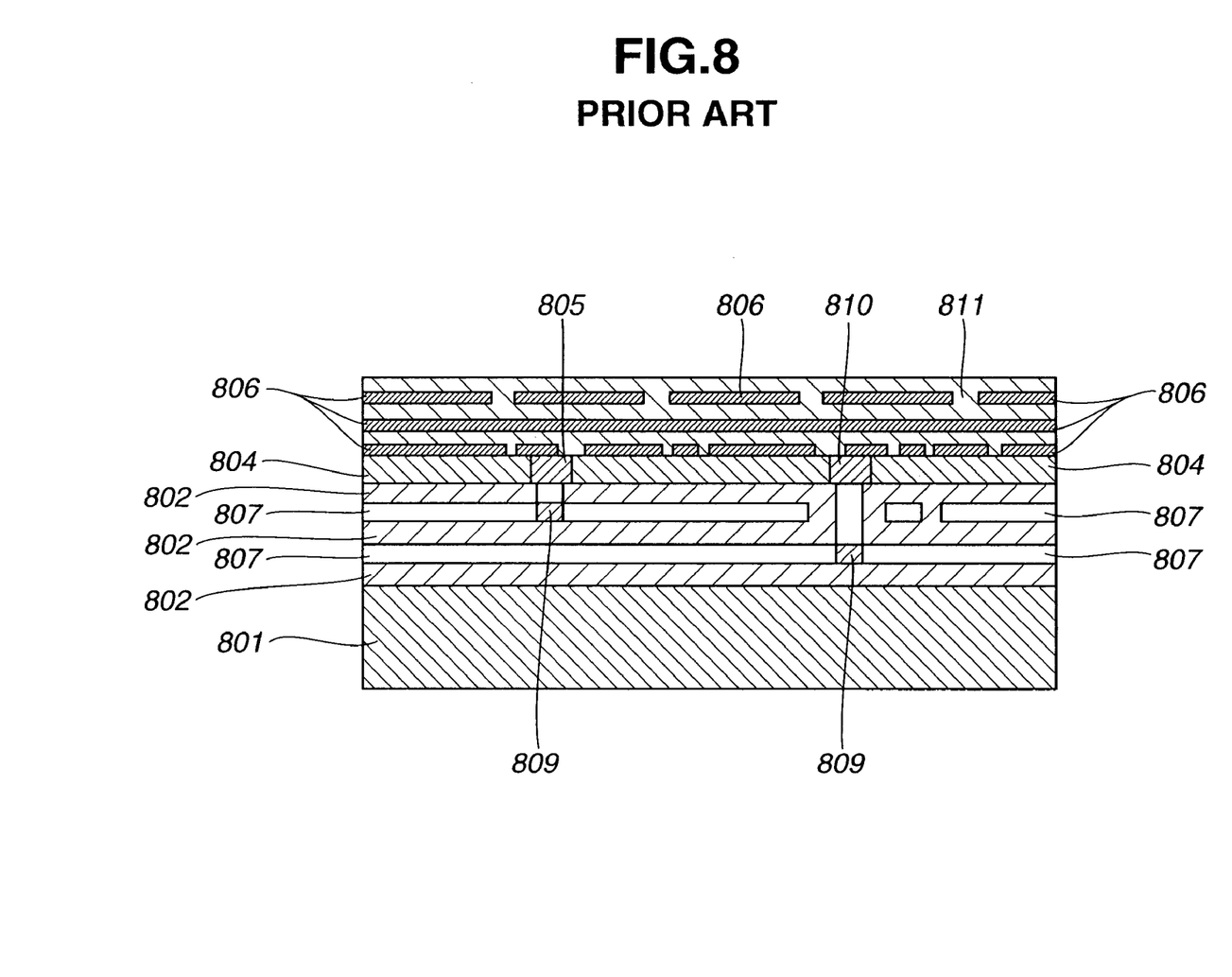
FIG. 8 is a schematic cross-sectional view illustrating a conventional layered board.

Further, Japanese Patent Laid-Open No. 5(1993)-218384 discloses a semiconductor integrated circuit as illustrated in FIG. 8. In semiconductor integrated circuit of FIG. 8, converting devices (a light emitting device 805, and a light receiving device 810) for performing conversion between an electrical signal and an optical signal, and an optical waveguide 810 are integrally arranged in the semiconductor integrated circuit, and there is provided a unit for performing signal transmission in the integrated circuit through the converting devices and the optical waveguide. In FIG. 8, there are further arranged a silicon semiconductor substrate 801, a substrate 802 of a silicon oxide layer, a silicon semiconductor logical operation integrated circuit 804, a metal wiring layer 806, a grating 809, and an insulating layer 811.

SUMMARY OF THE INVENTION

According to one aspect of the present invention, there is provided a layered board in which an insulating layer is interposed between first and second layers capable of transmission of electrical or optical signals, respectively, interconnection between the first and second layers by the signal is executed through a signal connecting path penetrating the insulating layer, and the signal connecting path has both a function of transmitting the electrical signal and a function of transmitting the optical signal.

According to the present invention, the signal connecting path penetrating the insulating layer has both the function of transmitting the electrical signal and the function of transmitting the optical signal as described above, and hence a compact EMI-reduced layered board with a down-sized signal connecting path can be provided.

These advantages, as well as others will be more readily understood in connection with the following detailed description of the preferred embodiments and examples of the invention in connection with the drawings.

DESCRIPTION OF THE PREFERRED EMBODIMENTS

Embodiments of a layered board, and apparatuses incorporating the layered board of the present invention will be described with reference to the drawings.

A layered board of the present invention is directed to a layered board wherein an insulating layer is interposed between first and second layers capable of transmitting electrical or optical signals, respectively, and interconnection between the first and second layers by the signal is executed through a signal connecting path penetrating the insulating layer. The layered board features that the signal connecting path has both a function of transmitting the electrical signal and a function of transmitting the optical signal.

The signal connecting path of the present invention can be constructed so as to have the function of transmitting the electrical signal and the function of transmitting the optical signal in one united body. The signal connecting path can also be constructed such that its central portion has the function of transmitting the optical signal while its peripheral portion has the function of transmitting the electrical signal. Further, the layered board of the present invention can be constructed so as to include an interchanging unit for interchanging signal transmissions between the transmission of the electrical signal through the signal connecting path and the transmission of the optical signal through the signal connecting path. A chip, such as an LSI, storing transmission protocol can be used as the interchanging unit, for example.

The first layer constituting the layered board of the present invention can be an electrical wiring layer. Further, the layered board of the present invention can be constructed so as to include plural electronic devices which are connected to each other through the signal connecting path. The layered board can also be constructed such that interconnection between the electronic device and the signal connecting path can be performed through an optical device. A device having an opto-electrical (O/E) converting function or an electro-optical (E/O) converting function can constitute the optical device.

Further, the first layer in the layered board of the present invention can be an optical waveguide layer capable of transmitting the optical signal in a planar manner. A film-shaped or sheet-shaped two-dimensional optical waveguide structure can constitute the optical waveguide layer.

A layered board of the present invention is also directed to a layered board which includes an optical waveguide layer capable of transmitting an optical signal in a planar manner in the waveguide layer, a transmission layer capable of transmitting an optical signal or an electrical signal, an insulating layer interposed between the transmission layer and the optical waveguide layer, a signal connecting path penetrating the insulating layer and capable of executing signal interconnection between the transmission layer and the optical waveguide layer, and a plurality of electronic devices connected to each other through the signal connecting path. This layered board features that the signal connecting path has both a function of transmitting the electrical signal and a function of transmitting the optical signal. The layered board can also be constructed such that transmission of the signal between the signal connecting path and the optical waveguide layer can be performed through a light scattering structure disposed in the optical waveguide layer.

The signal connecting path, which is an important feature of the layered board of the present invention, will hereinafter be described with reference to the drawings. As disclosed herein, the signal connecting path of the present invention is a path provided penetrating the insulating layer for achieving interconnection of the signal between plural layers stacked with the insulating layer interposed therebetween. Generally speaking, the signal connecting path corresponds to a so-called via, a via-hole, a contact, a contact-hole, or the like. In this specification, a signal connecting path is also referred to as a via or a via-hole as occasion demands.

Figure 2A:
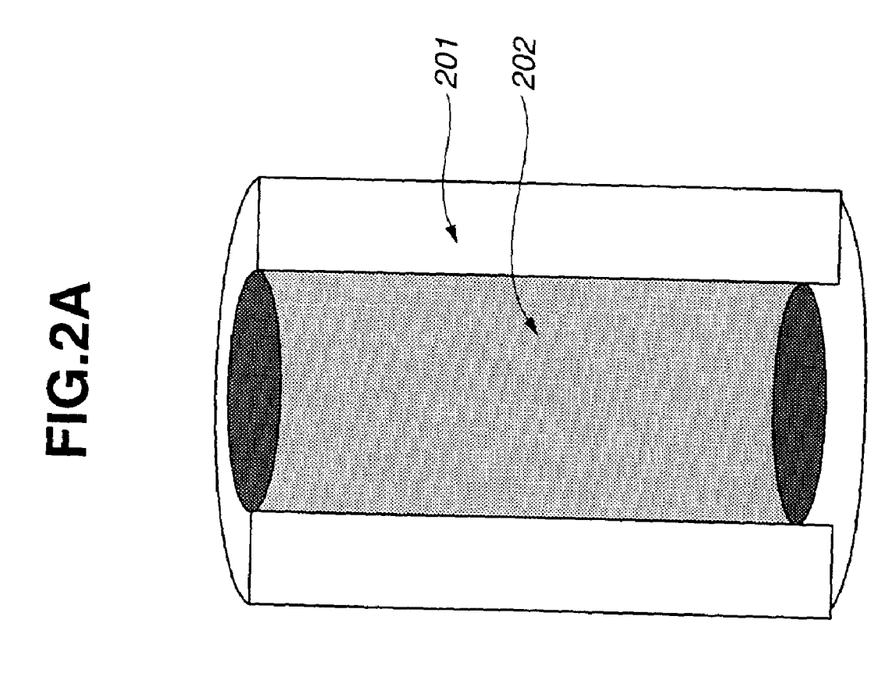
FIGS. 2A to 2C are schematic cross-sectional views illustrating examples of a signal connecting path (a via) provided in the layered board of the present invention, respectively.
Figure 2B:
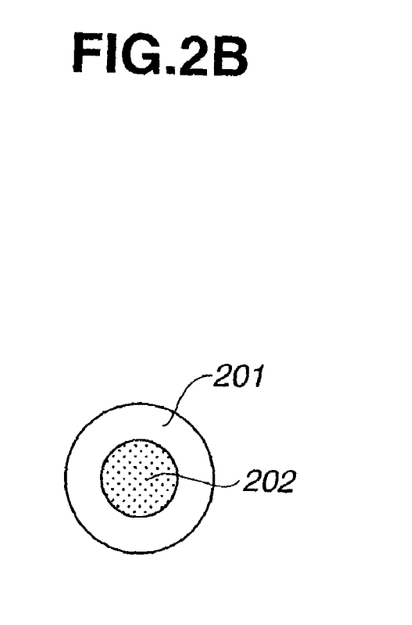
Figure 2C:
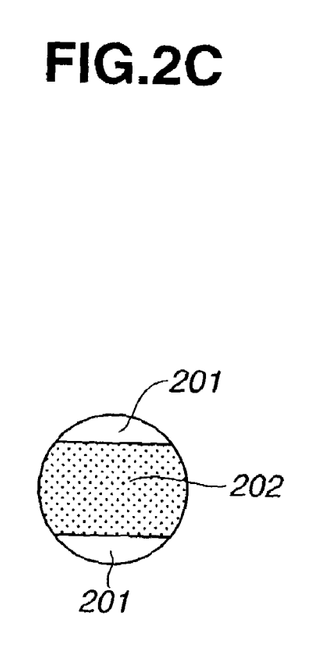

FIGS. 2A to 2C illustrate examples of the signal connecting path in the layered board of the present invention. For example, the signal connecting path can have a configuration in which a metal material 201 is layered on an inner wall of a via having a circular cross section, and a central portion of the via is filled with an insulating material 202, as illustrated in FIGS. 2A and 2B. In this configuration, its peripheral portion has the function of transmitting the electrical signal, and its central portion has the function of transmitting the optical signal. The central portion can be a hollow space. In this case, it is desirable in the light of signal transmission to form an insulating layer on a metal plated layer of the electrical via portion such that the electrical via portion can be reliably separated from the optical via portion, thereby reducing disturbance to each signal. Plural electrical wiring portions 201 can be provided in a single signal connecting path (via) by forming plural separate metal stripes as illustrated in FIG. 2C. Further, the via can be constructed such that an optical via having only a function of transmitting an optical signal is established from its halfway portion. An optical IO (Input/Output) device for performing O/E or E/O conversion can be provided at an end portion of the via. The optical IO device is a unit wherein a driving circuit, a signal receiving circuit, or the like is provided together with a surface emitting laser, a photodiode, or the like.

Operation of the layered board of the present invention will be described.

When information is transmitted at high speed (for example, 1 Gbps) in a structure in which metal electrical wires (metal wiring) are formed closely to each other, the magnitude of EMI in the neighborhood of the electrical wires is proportional to the product of strengths of generating sources (i.e., signal frequency, signal waveform, driving current, etc.), transmission coefficients (i.e., resonance between the metal wiring and electrical source lines, coupling between the electrical wiring and nearby lines, etc.), and antenna factors (i.e., configurations of connector and electrode in the electrical wiring, etc.). It can be paraphrased by a simple sentence that the noise level increases as the wiring length, the current value and the signal rate increase, or as the signal pulse approaches a square waveform. Accordingly, the EMI cannot be eradicated so long as the metal wiring is provided closely to a CPU (Central Processing Unit).

Those disadvantages can be alleviated by employing the optical waveguide in place of the electrical wiring, since no electromagnetic induction appears in the optical waveguide, and the transmission factor becomes zero. On the other hand, the physical size of each waveguide is more than ten times larger than that of the electrical wire, and hence if the overall electrical wiring is replaced by the optical waveguide, other disadvantages, such as increase in the entire size and increase in power losses due to bending, appear.

Further, when the optical waveguide is to be introduced, the electrical wiring pattern must be modified. Particularly, when information transmission between stacked layers is to be performed through electrical vias only, a wide area is needed for the vias, a layout of components is restricted, and the electrical via causes a discontinuous point of impedance. As a result, wiring delays and signal degradation are likely to be brought forth. On the other hand, when signal transmission is to be executed using the optical waveguide, a wider area is needed than the electrical via. Accordingly, it is difficult to introduce a lot of optical waveguides.

In the present invention, the signal connecting path (via) in the layered board has the function of transmitting the optical signal as well as the function of transmitting the electrical signal. The signal connecting path, hence, has a high flexibility since data transmission can be performed using both the electrical signal and the optical signal.

In the signal connecting path provided in a signal interconnection circuit according to the present invention, its central portion can take charge of the function of transmitting the optical signal, and its peripheral portion can take charge of the function of transmitting the electrical signal. In the electrical via, there is no need to form a thick conductive layer since high-speed data flows only through a portion near its surface (for example, down to a depth of about several hundreds nm at 100 MHz; so-called skin effect). The thickness decreases as the signal frequency increases. Thus, the central portion (a core portion) of the via is not used for transmission of the electrical signal, and hence it can be used as an optical waveguide (an optical via portion). The core portion can be a hollow space. For the purposes of enhancing its optical conductivity, it is preferable to fill the core portion with a insulator to increase its refractive index. In such a construction, the optical signal can be transmitted being confined within the central portion.

In the present invention, the signal connecting path in the layered board is not used only for transmission of data from a specific device. Data from plural devices can be transmitted commonly using one signal connecting path. A way of using the signal connecting path can be appropriately designed according to arrangement of electronic devices, such as LSIs, provided in the layered board, etc.

In the layered board of the present invention, the signal connecting path is needed for the purposes of obtaining a three-dimensional wiring function. In one configuration of the present invention, a film-shaped waveguide layer can be used as a layer constituting the layered board. This optical waveguide layer can achieve a planar (two-dimensional) transmission of the optical signal in the layer. Accordingly, even when the signal connecting path is formed at a desired location penetrating the optical waveguide layer, adverse influence of the signal connecting path is negligible since the optical signal propagates in the optical waveguide layer spreading two-dimensionally. In other words, an EMI-free optical waveguide can be introduced into such a structure without any influence on existent design scheme.

More specific embodiments will be described with reference to the drawings.

First Embodiment

Figure 1A:
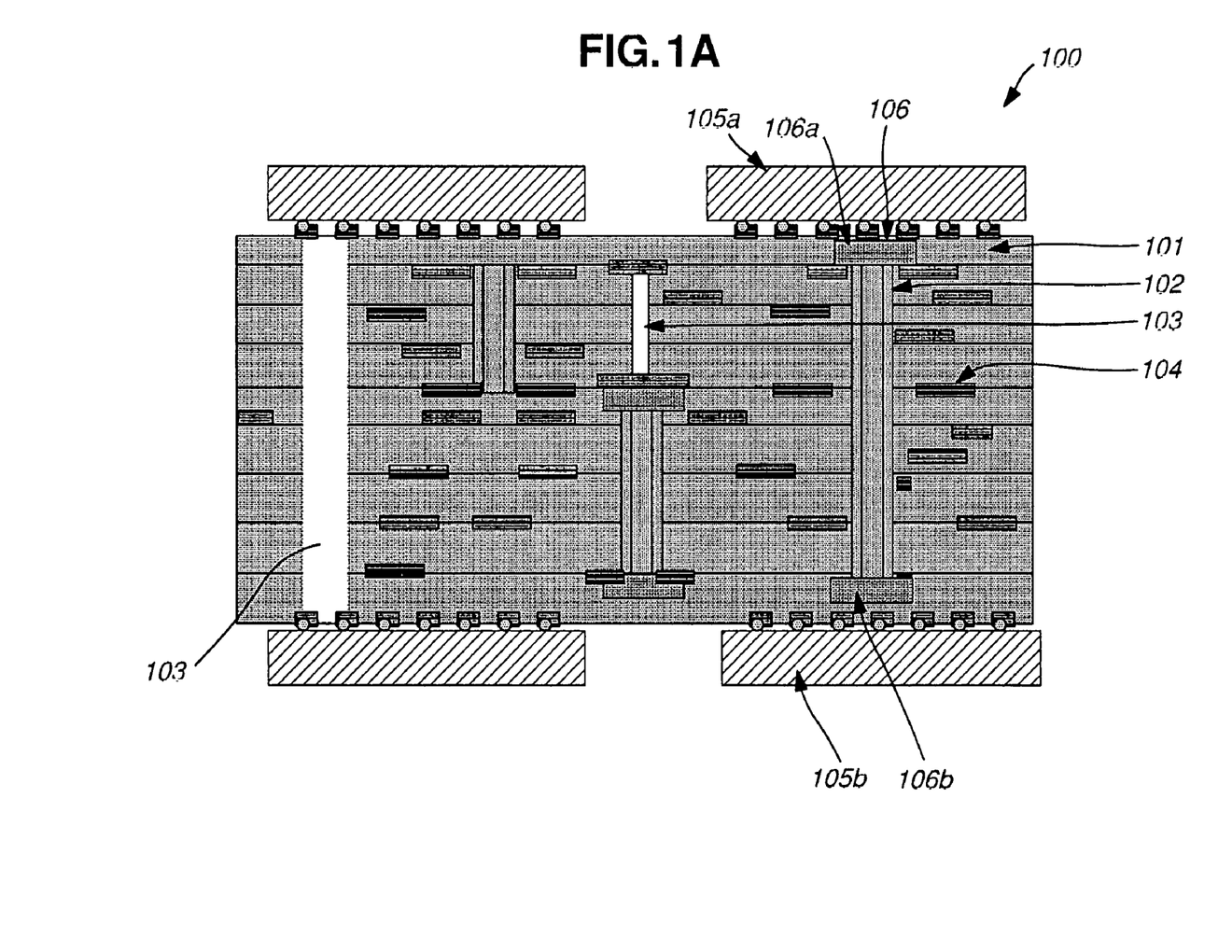
FIG. 1A is a schematic cross-sectional view of an apparatus illustrating an embodiment of a layered board according to the present invention.
Figures 1B, 1C:
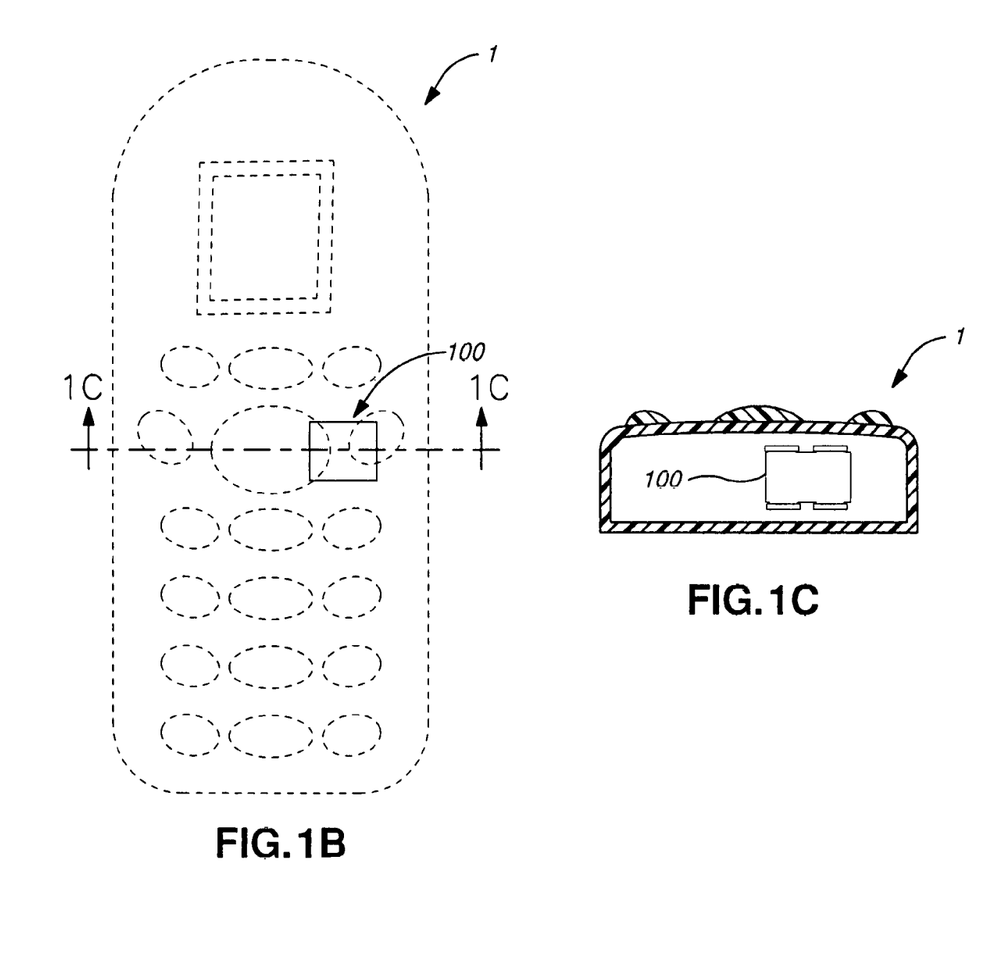
FIG. 1B shows an illustrative example of the apparatus of FIG. 1A constructed as a cellular phone.
FIG. 1C is a cross section view taken along line 1C—1C shown in FIG. 1B.

A first embodiment of an apparatus 100 of the present invention constructed as a cellular phone 1 will be described with reference to FIGS. 1A, 1B, and 1C. In FIG. 1A, reference numeral 101 designates a multi-layer layer comprised of plural electrical wiring layers. Reference numeral 102 designates a signal connecting path. Reference numeral 103 designates an electrical via. Reference numeral 104 designates an electrical wire provided in the electrical wiring layer. Reference numeral 105 designates an LSI flip-chip bonded to the multi-layer 101. Reference numeral 106 designates an optical IO device. The optical IO device 106 can be a surface emitting laser (for example, its oscillation wavelength is 0.8 microns, and its optical output is 1 mW) serving as a signal transmitting device. The optical IO device 106 can be a pin photodiode (for example, a material of Si or GaAs can be used) serving as a light receiving device. FIG. 1B shows the apparatus 100 constructed as a cellular phone 1. FIG. 1C is a cross section view taken along line 1C—1C shown in FIG. 1B.

FIG. 2A is an enlarged longitudinal cross-sectional view illustrating the signal connecting path 102. In FIG. 2A, reference numeral 201 designates an electrical wiring portion, and reference numeral 202 designates an optical waveguide portion. The electrical wiring portion 201 is formed of a metal, and the optical waveguide portion 202 is formed of an insulator. It is preferable that the refractive index of a central portion of the waveguide portion 202 is set relatively high. Only the electrical signal is transmitted through the electrical wiring portion 201, and only the optical signal is transmitted through the waveguide portion 202. A signal can be transmitted through the signal connecting path 102 either electrically or optically. The signal transmitting portion of the optical IO device 106 is preferably comprised of a vertical cavity surface emitting laser (VCSEL), or a surface emitting laser, which can be driven directly by an electrical signal (a logic signal) with low voltage and small current. An integrated-type pin photodiode (PD) and an amplifier can be suitably used as the signal receiving portion.

In general, in a region of a low transmission rate of about 10 Mbps, there is no fear of EMI and EMC if a filter or a shield is inserted in the circuit. Accordingly, in this case, signal transmission is performed using the electrical wiring portion in the signal connecting path 102. Naturally, the layered board can be designed such that signals from lower transmission rates are transmitted using the optical waveguide portion without inserting any filter and shield. However, from the transmission rate exceeding about 100 Mbps, the EMI is likely to occur and the layered board begins to be sensitive to external environment of electromagnetic waves depending on the wiring length. Under such a condition, if data is transmitted using only the electrical wiring portion, it possibly adversely influences not only itself but also another circuit. Therefore, this embodiment solves this disadvantage by using the optical waveguide portion 202.

A fabrication method of the signal connecting path 102 adopted in this embodiment will be described with reference to FIGS. 3A to 3D.

Figure 3A:
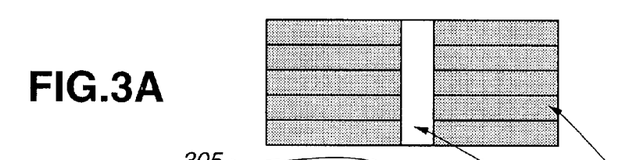
FIGS. 3A to 3D are schematic cross-sectional views illustrating fabrication steps of the layered board of the present invention, respectively.

As illustrated in FIG. 3A, a via hole 301 is formed at any desired location of a multi-layer board 101 by using a laser, or photolithography and etching.

Figure 3B:
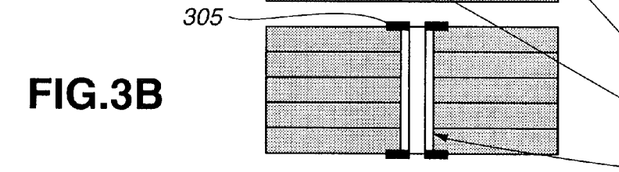

A conductive layer 302 of Au, Cu, or the like is then formed only on an inner wall of the via hole 301 using plating, such as electroless plating, or sputtering, as illustrated in FIG. 3B. An insulating layer can be inserted as an underlaid layer as occasion demands. Further, lands 305 are formed on end portions of the via hole 301.

Figure 3C:
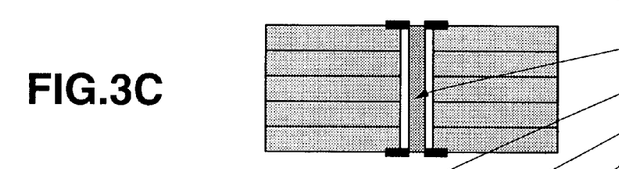

A central portion, which is to be an optical waveguide portion, is then filled with an insulating material 304 as illustrated in FIG. 3C. Here, filler material (for example PMMA) for making the refractive index of the central portion relatively high is selected such that light can be confined within the central portion. Signals can hence be transmitted in such a manner that the electrical signal is securely separated from the optical signal.

Figure 3D:
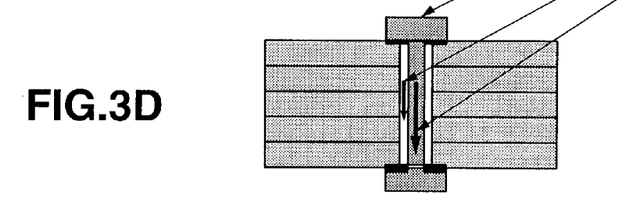

As illustrated in FIG. 3D, optical IO devices (a light transmitting device and a light receiving device) 106 are disposed on the lands 305 formed on uppermost and lowermost layers with being aligned with end faces of the via 301, respectively.

When necessary, a built-up layer, or the like for wiring can be layered on a top or bottom surface.

In the thus-fabricated construction, an electrical signal 107 and an optical signal 108 can be transmitted through the conductive layer 302 and the insulating portion 304 selectively, or simultaneously and independently, respectively.

Operation of the first embodiment will be described with reference to FIGS. 1A, 1B, 1C, 2A, and 2B. Here, transmission of data from the LSI 105a to the LSI 105b is exemplified.

Initially, the LSI 105a transfers an electrical signal to the LSI 105b using the electrical wiring portion 201 of the signal connecting path 102. It is here assumed that this transfer of the electrical signal fails for the reason that an electronic device adjacent to the LSI 105a is performing processing with a large load at high speed, or the like.

Accordingly, medium for data transfer is changed to the optical waveguide portion 202 in the signal connecting path 102. Such change is executed according to a signal from an LSI that stores the transmission protocol which is beforehand designed such that medium for data transfer can be switched under such a condition.

After the above change, the electrical signal from the LSI 105a is EO-converted by the optical IO device 106a disposed in the electrical wiring layer close to the LSI 105a. An optical signal generated by this EO-conversion is then transferred to an opposite end of the signal connecting path 102 through the optical wiring portion 202 of the path 102.

The optical signal is received by the optical IO device 106b arranged in the electrical wiring layer near the LSI 105b, and is OE-converted. An electrical signal obtained by this OE-conversion is taken into the LSI 105b.

In the above-discussed layered board, information can be transferred through the signal connecting path 102 either as the electrical signal or as the optical signal. The layered board can be appropriately designed such that signals can be flexibly and reliably transmitted under an EMI-reduced or MEI-free condition.

Second Embodiment

Figure 4:
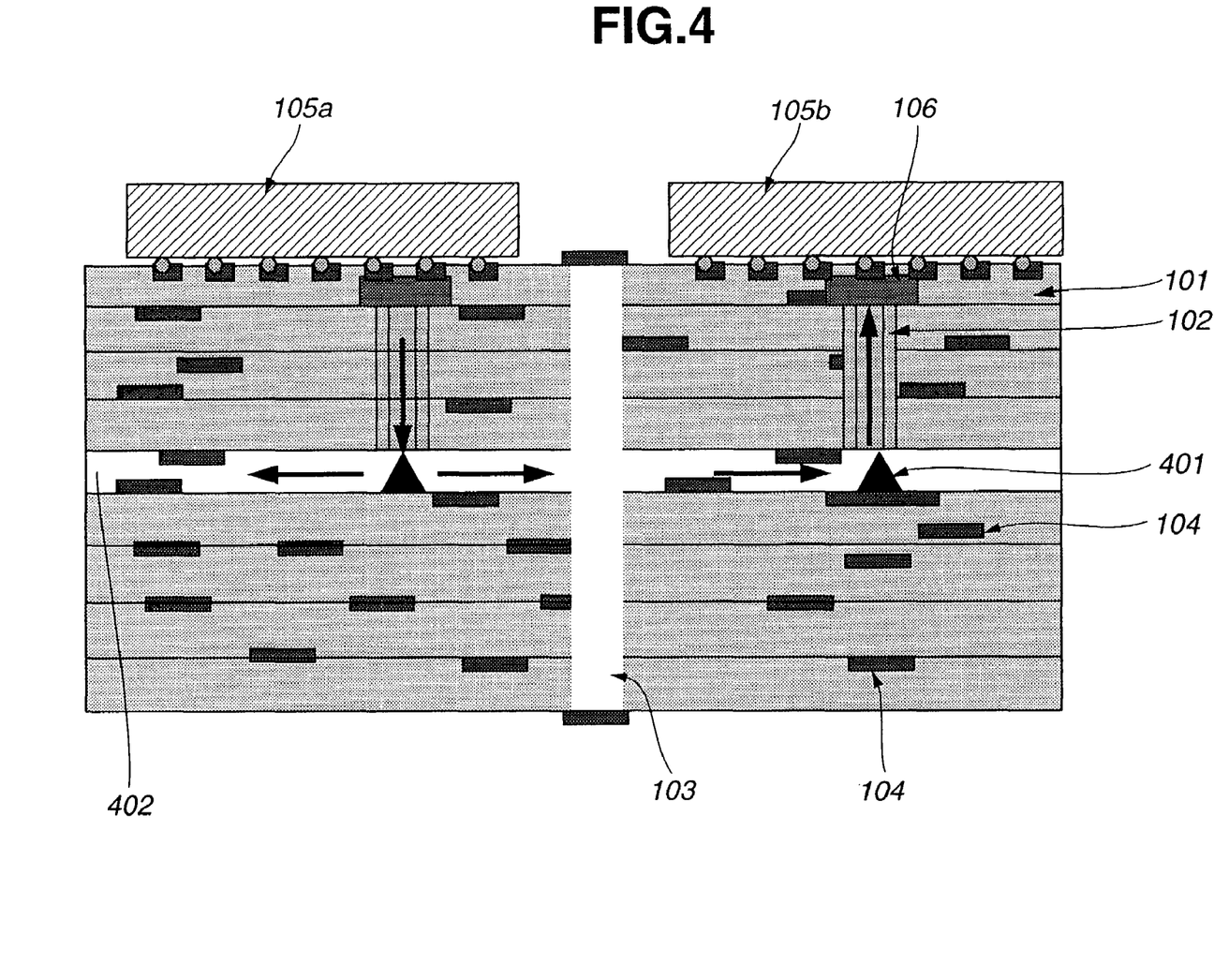
FIG. 4 is a schematic cross-sectional view illustrating another embodiment of the layered board according to the present invention.

A second embodiment of the layered board of the present invention will be described with reference to FIG. 4. In the layered board of the second embodiment, a signal connecting path 102 is formed in a multi-layer board 101 including an optical waveguide layer (film) 402.

The second embodiment differs from the first embodiment in that only one optical waveguide layer 402 is inserted in the multi-layer board 101, that light having propagated in the optical waveguide layer 402 is transmitted through the optical waveguide portion 202 in the signal connecting path 102, and that light emitted from the optical IO device 106 and transmitted through the optical waveguide portion 202 in the signal connecting path 102 propagates two-dimensionally in the optical waveguide layer 402.

The second embodiment is similar to the first embodiment in that data can be transferred as the optical signal and as the electrical signal using the optical waveguide layer (film) 402 and the signal connecting path 102. The optical waveguide layer 402 is capable of two-dimensional transmission of the optical signal, and is formed of a transparent polymer.

Also in the second embodiment, the signal connecting path 102 is provided in the layered board formed by stacking the electrical wiring layer and the optical waveguide layer such that three-dimensional transmission of the electrical signal and the optical signal can be effected.

A fabrication method of the second embodiment will be described. The order of the following fabrication steps can be appropriately altered according to circumstances.

The optical waveguide layer 402 is formed in the multi-layer board 101. The optical waveguide layer 402 is interposed between multi-layer electrical wiring layers, for example. A light scattering structure 401 comprised of a conical mirror, or the like can be arranged at an appropriate location in the optical waveguide layer 402.

Vias 102 and 103 extending down to the optical waveguide layer 402 are formed at any desired locations of the multi-layer board.

Figure 5:
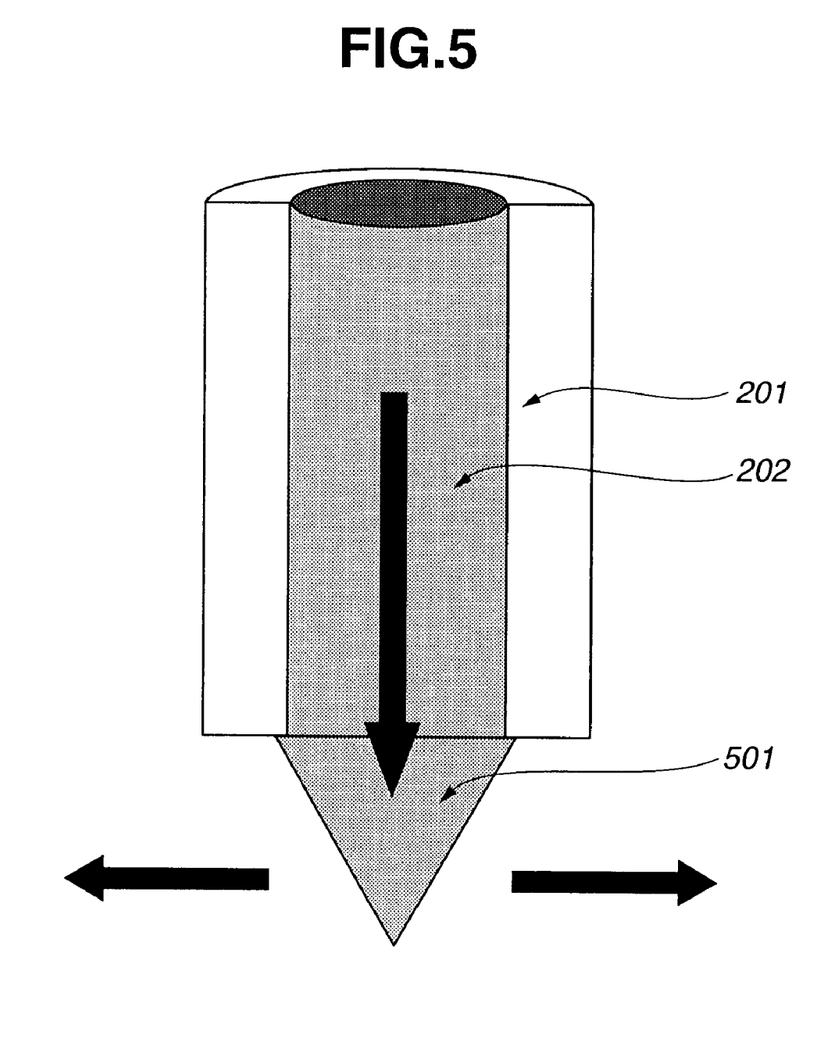
FIG. 5 is a schematic cross-sectional view illustrating another example of the signal connecting path provided in the layered board of the present invention.

The light scattering structure 401 is encased in the optical waveguide 402 such that light from the signal connecting path 102 can propagate in the optical waveguide layer 402. Here, the light scattering structure 401 is comprised of a conical metal structure, but it can be a hemispherical structure, or the like. The light scattering structure can be beforehand formed in an opto-electrical hybrid fiber. FIG. 5 illustrates this structure. In FIG. 5, reference numeral 501 designates a conical light scattering structure formed by shaping a tip portion of a signal connecting path (via) which is a fiber having a function of transmitting the electrical signal and a function of transmitting the optical signal. The optical path of propagating light can be changed by making refractive indexes of the light scattering structure 501 and the optical waveguide layer 402 different from each other.

The signal connecting path 102 is fabricated similarly to the first embodiment, or by inserting the fiber of FIG. 5 into the via and thermally treating it, for example. The electrical via 103 is formed by filling the via with an electrical conductor. In the thus-fabricated structure, the optical path of light transmitted through the optical waveguide portion in the signal connecting path 102 is changed by the light scattering structure 401 or 501 formed by either of the above-discussed fabrication methods, and the light is diffused in the optical waveguide layer 402. Alternatively, the optical path of light transmitted in the optical waveguide layer 402 is changed by the light scattering structure 401 or 501, and the light is transmitted through the optical waveguide of the signal connecting path 102.

The optical IO devices 106 are then arranged at any desired locations similarly to the first embodiment.

Operation of the second embodiment will be described. When high-speed transfer of data is to be performed from the LSI 105a to the LSI 105b, the transfer is conducted through the optical waveguide portion since the transfer is likely to be subjected to adverse influences of wiring delays and the EMI in the event that the electrical wiring is used.

An electrical signal from the LSI 105a is therefore EO-converted by the optical IO device 106 disposed in the electrical wiring layer near the LSI 105a. An optical signal generated by this EO-conversion is then transferred to an opposite end (a position in the optical waveguide layer 402) of the signal connecting path 102 through the optical waveguide portion 202 of the path 102.

The optical signal is diffused in the optical waveguide layer 402 by the light scattering structure 401 disposed in the waveguide layer 402. After reaching another light scattering structure 401 near another LSI 105b, the light is again scattered thereby, and guided into another signal connecting path 102.

After being transmitted through the another signal connecting path 102, the light is OE-converted by the optical IO device 106 disposed in the electrical wiring layer near the LSI 105b. An electrical signal obtained by this OE-conversion is then taken into the LSI 105b.

In the above-discussed layered board of the second embodiment, the optical signal can be transferred not only in a layering direction but in in-plane two-dimensional directions.

A multi-layer opto-electrical hybrid wiring board including alternately-stacked electrical wiring layers and optical waveguide layers can be constructed by repeating the above-discussed fabrication steps. The multi-layer opto-electrical hybrid wiring board can be obtained by the following fabrication method, for example. A photonic ball integrated circuit (IC) (a spherical device described later), which is the optical IO device, can be disposed on the electrical wiring layer, and the two-dimensional optical waveguide layer can be stacked on its surface. A second electrical wiring layer equipped with a photonic ball IC is then bonded to the stacked structure. Vias are formed at desired locations, and electrical contact is established by forming the signal connecting path and the electrical via using electroplating, and so forth.

The photonic ball IC is a device in which a light emitting device, such as a GaInNAs/AlGaAs-group surface emitting laser, a circuit for driving the light emitting device, an electronic device, such as a parallel/serial converting circuit, and the like are integrally formed on the surface of a spherical Si substrate. Alternatively, in a spherical light receiving device, a pin layer of a light receiving portion is formed on the surface of a spherical Si substrate (for example, its southern hemispherical side), and a circuit for applying a reverse bias to the light receiving portion, an amplifying circuit, and the like are integrally formed on another hemispherical side (for example, a northern hemispherical side) opposite to the side of the light receiving portion.

In the second embodiment, a sheet-shaped optical waveguide layer is used as the optical waveguide layer, but the optical waveguide is not limited thereto. For example, a line-shaped linear waveguide for fully confining light in lateral directions can be formed, and the signal connecting path (via) can be coupled to the linear waveguide through a 45-degree mirror, or the like. In this case, however, the location of the signal connecting path (via) is restricted, as compared with the case where the sheet-shaped optical waveguide layer is used.

Third Embodiment

Figure 6:
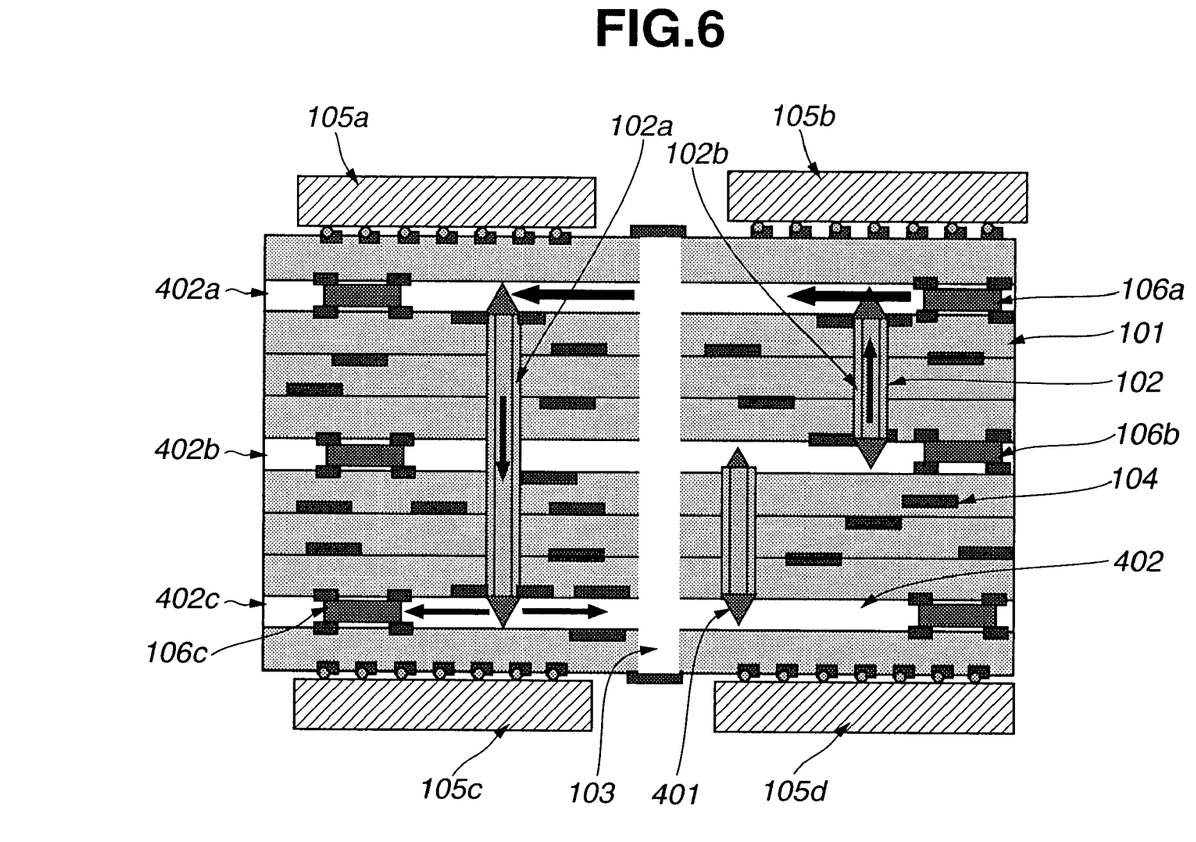
FIG. 6 is a schematic cross-sectional view illustrating still another embodiment of the layered board according to the present invention.

A third embodiment of the layered board of the present invention will be described with reference to FIG. 6. In the layered board of the third embodiment, plural sheet-shaped optical waveguide layers (optical films) are used, so that an optical transmission path from one optical film to another optical film through the signal connecting path (via) can be established.

The third embodiment differs from the first embodiment in that plural optical waveguide layers 402 are provided, and that an optical interconnection path from one optical waveguide layer 402 to another optical waveguide layer 402 through the signal connecting path (via) 102 can be used.

A fabrication method of the third embodiment will be described. A multi-layer board, in whose optical waveguide layer 402 the optical IO device 106 is encased, is initially fabricated. The optical IO device can be the above-discussed photonic ball IC (a spherical light emitting device, or a spherical light receiving device), a semiconductor laser with an annular resonator capable of emitting a plurality of beams, or the like.

The signal connecting path 102 is then fabricated similarly to the first and second embodiments. In the structure of FIG. 6, a penetrating-type signal connecting path 102a and a non-penetrating-type signal connecting path 102b are provided.

The third embodiment differs from the first and second embodiments in that optical waveguide layers 402 are connected through the signal connecting path 102, and in that the optical IO device 106 is not disposed at the end of the signal connecting path 102, but is encased in the optical waveguide layer 402. It is, however, possible to provide a ring laser, or the like that is arranged at the end of the signal connecting path 102, and is at the same time encased in the optical waveguide layer 402 such that light can be emitted into both the signal connecting path 102 and the optical waveguide layer 402. After the signal connecting path 102 and the electrical via 103 are formed, it is possible to bond multi-layer wiring layers to each other, or to stack an additional layer (a built-up layer) thereon.

Operation of the third embodiment will be described. Data transfer from the LSI 105b to the LSI 105c is considered in the structure of FIG. 6. Although the LSI 105b and the LSI 105c can be connected through the electrical wiring layer, stable data transfer is difficult to achieve due to the EMI and wiring delays in the event of high-speed data transmission.

An electrical signal from the LSI 105b is therefore EO-converted by the optical IO device 106a disposed in its nearby electrical wiring layer. An optical signal generated by this EO-conversion is then two-dimensionally transmitted in the optical waveguide layer 402a, and reaches the signal connecting path 102a The optical signal is guided into the optical waveguide portion 202 of the signal connecting path 102a by the light scattering structure 401 disposed at one end of the signal connecting path 102a, and is transmitted through the optical waveguide portion 202. The optical signal is transmitted to the other end of the signal connecting path 102a (namely the optical waveguide layer 402c).

After reaching the light scattering structure 401 at the other end of the signal connecting path 102a, the light is again scattered thereby, and is guided and transmitted in the optical waveguide layer 402c. The optical signal is OE-converted by the optical IO device 106c disposed in the optical waveguide layer 402c. An electrical signal obtained by this OE-conversion is then connected to the LSI 105c through the electrical wiring layer. In other words, the data signal from the LSI 105b is directly transferred to the LSI 105c as the optical signal without subjected to the opto-electrical conversion on its way.

As discussed in the foregoing, stable data transfer can be flexibly effected without EMI because of the presence of the optical waveguide even at a place where the electrical wiring layers are intricately arranged. In the above operation, the optical waveguide layer 402a is used by the LSI 105b, but the optical waveguide layer 402a can also be commonly used by other electronic devices. Specifically, an electrical signal from the LSI 105a can also be transferred to another electronic device (for example, the LSI 105d) through a common optical waveguide layer 402a. Further, signal transmission line can also be flexibly established by using another signal connecting path 102b and another optical waveguide layer 402b, and data can be transmitted between electronic devices.

As described in the foregoing, also in the third embodiment, optical signal transmission and electrical signal transmission can be selectively or simultaneously employed not only in the layering direction but in the in-plane direction.

Fourth Embodiment

Figure 7:
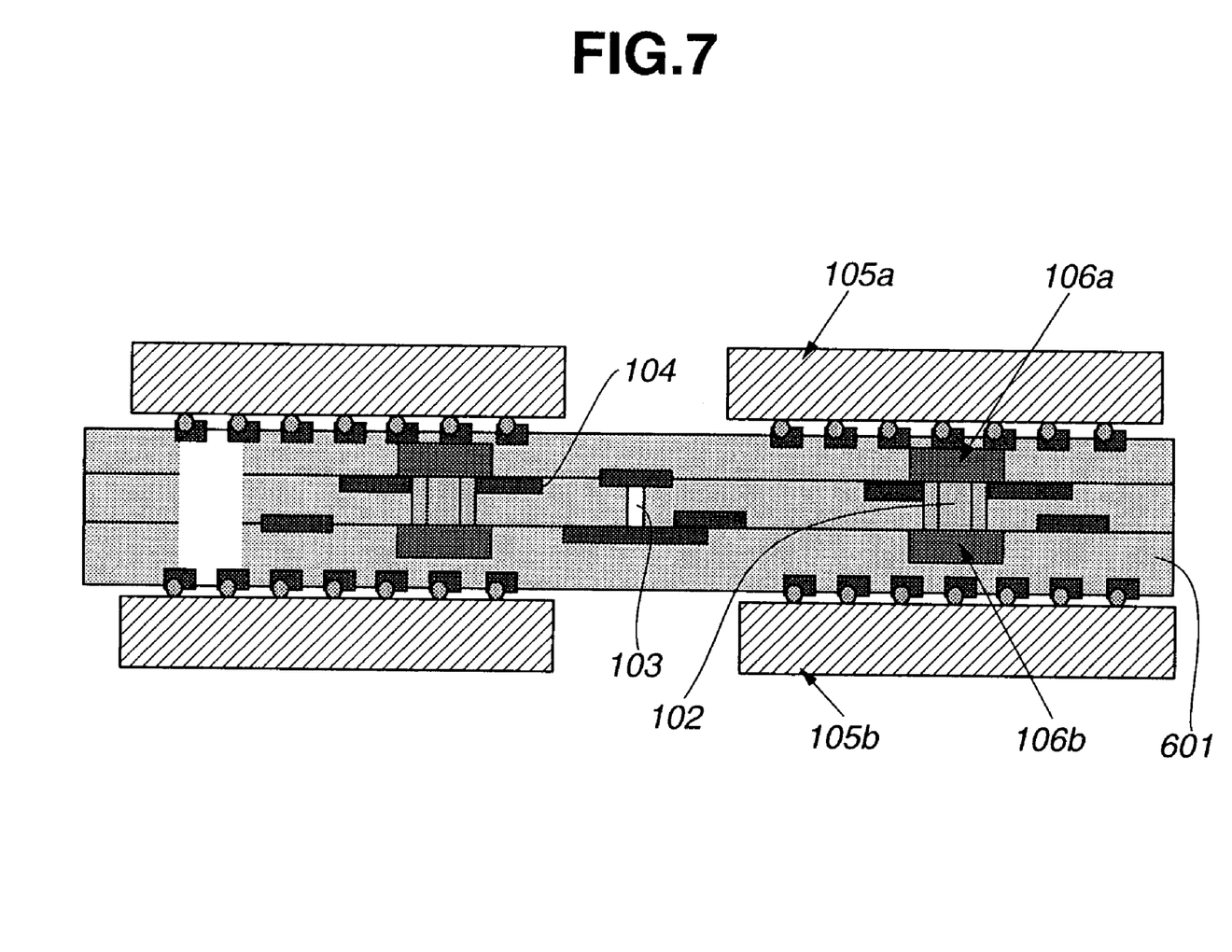
FIG. 7 is a schematic cross-sectional view illustrating yet another embodiment of the layered board according to the present invention.

FIG. 7 illustrates a fourth embodiment of the layered board. While plural wiring layers are used in the above-discussed embodiments, the fourth embodiment includes only one electrical wiring layer 601. Elements designated by reference numerals in FIG. 7 are discussed in the first embodiment. The concept of the present invention can also be applied to such a simple layered board, and the signal connecting path 102 can be used therein.

Fifth Embodiment

In a fifth embodiment, a layered board of the present invention is used in mobile equipment such as cellular phones. The cellular phone ordinarily includes a high-frequency (radio-frequency (RF)) unit for transmitting and receiving signals in a Giga-Hertz (GHz) band, a signal processing unit for processing signals in a baseband form, a digital signal processor (DSP) for executing multimedia processing, and so forth. Generally, respective components are independently designed, and are disposed in printed circuit boards (PCBs) such that they do not interfere with each other. Although it is possible to somewhat increase its arrangement density, an optimum layout for preventing mutual interference is needed to maintain its stable operation, and resultantly the arrangement density cannot be so highly raised.

When the layered board of the present invention is used in such mobile equipment, no influences of the EMI, and the like appears even if the above-mentioned electronic devices are arranged with high density, and hence highly-reliable signal processing can be achieved.

Sixth Embodiment

In a sixth embodiment, a layered board of the present invention is applied to a PDA which is comprised of a (digital signal processor (DSP) for executing multimedia processing, a CPU, a display, a memory, and so forth. Also in this embodiment, although it is possible to achieve a layout with a relatively high density, it is not easy to attain signal stability. Particularly, when the clock of the CPU largely changes, the EMI is likely to occur, resulting in hindrance to stable operations of other devices. When the layered board of the present invention is used as a printed circuit board in the PDA, the above-noted disadvantage can be solved.

While the present invention has been described with respect to what is presently considered to be the preferred embodiments, it is to be understood that the invention is not limited to the disclosed embodiments. The present invention is intended to cover various modifications and equivalent arrangements included within the spirit and the scope of the appended claims.

What is claimed is:

1. An apparatus comprising:
   a layered board including an optical layer includes an optical waveguide layer capable of transmitting the optical signal in a planar manner in said waveguide layer;
   a second layer capable of transmitting at least one of an electrical signal and an optical signal;
   an insulating layer interposed between the optical layer and said second layer;
   a signal connecting path penetrating said insulating layer, said signal connecting path establishing interconnection of a signal between said optical layer and said second layer, and said signal connecting path performing both a function of transmitting an electrical signal and a function of transmitting an optical signal;
   means for transmitting and receiving a high-frequency signal; and
   means for processing the high-frequency signal,
   wherein said optical waveguide includes one of a conical and hemispherical light scattering structure, said light scattering structure being disposed in said optical waveguide layer, and a signal being transmitted between said signal connecting path and said optical waveguide layer through said light scattering structure, and
   wherein said apparatus is incorporated in a cellular phone.

* * * * *

UNITED STATES PATENT AND TRADEMARK OFFICE
CERTIFICATE OF CORRECTION

PATENT NO. : 7,072,535 B2
APPLICATION NO. : 10/631796
DATED : July 4, 2006
INVENTOR(S) : Mamoru Uchida It is certified that error appears in the above-identified patent and that said Letters Patent is hereby corrected as shown below:

COLUMN 1
    Line 39, "ceramics" should read --ceramic--.

COLUMN 2
    Line 5, "layer" should read --layers--.
    Line 6, "is" should read --are--.
    Line 7, "layer" should read --layers--.
    Line 8, "is" should read --are--.
    Line 10, "No. 5(1993)-218384" should read --No. 5-218384--.

COLUMN 5
    Line 41, "a" should read --an--.

COLUMN 6
    Line 29, "is" should read --be--.

Signed and Sealed this

Second Day of January, 2007

JON W. DUDAS
*Director of the United States Patent and Trademark Office*